US012672485B2

(12) United States Patent (10) Patent No.: US 12,672,485 B2
Oguchi et al. (45) Date of Patent: Jun. 30, 2026

(54) PIEZOELECTRIC ELEMENT

(71) Applicant: TDK CORPORATION, Tokyo (JP)

(72) Inventors: Keiji Oguchi, Tokyo (JP); Yasuyuki Satoh, Tokyo (JP); Satoshi Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1015 days.

(21) Appl. No.: 17/559,223

(22) Filed: Dec. 22, 2021

(65) Prior Publication Data

US 2022/0209097 A1 Jun. 30, 2022

(30) Foreign Application Priority Data

Dec. 25, 2020 (JP) ................................. 2020-216442

(51) Int. Cl.
*H01L 41/047* (2006.01)
*H10N 30/50* (2023.01)
*H10N 30/87* (2023.01)

(52) U.S. Cl.
CPC ......... *H10N 30/508* (2023.02); *H10N 30/871* (2023.02); *H10N 30/872* (2023.02)

(58) Field of Classification Search
CPC ... H10N 30/508; H10N 30/871; H10N 30/872
USPC ........................................ 310/328, 365, 366
See application file for complete search history.

(56) References Cited

U.S. PATENT DOCUMENTS

2001/0047796 A1* 12/2001 Yamada ............. F02M 63/0026
123/498
2009/0021114 A1* 1/2009 Adachi .................. H02N 2/004
310/323.16
2011/0001399 A1* 1/2011 Oguni ...................... H01C 1/14
310/366

FOREIGN PATENT DOCUMENTS

JP 2001-230463 A 8/2001
JP 2011-165935 A 8/2011
JP 2018-182194 A 11/2018
JP 2019-176050 A 10/2019
WO 2007/091443 A1 8/2007
WO 2018193863 A1 10/2018

* cited by examiner

*Primary Examiner* — Derek J Rosenau
(74) *Attorney, Agent, or Firm* — Oliff PLC

(57) ABSTRACT
A piezoelectric element includes a laminate, a plurality of internal electrodes, and a plurality of external electrodes. The laminate includes a plurality of piezoelectric layers that is laminated. The laminate includes a pair of main faces facing away from each other in a laminating direction of the plurality of piezoelectric layers, a pair of end faces facing away from each other in a first direction crossing the laminating direction, and a pair of side faces facing away from each other in a second direction crossing the laminating direction and the first direction. The plurality of internal electrodes is disposed in the laminate to be laminated in the laminating direction. Each of the pair of main faces, the pair of end faces, and the pair of side faces is a polished surface that is polished. Each ridge portion of the laminate has a rounded chamfered shape.

5 Claims, 7 Drawing Sheets

PIEZOELECTRIC ELEMENT

TECHNICAL FIELD

The present disclosure relates to a piezoelectric element.

BACKGROUND

WO2007/091443 discloses a piezoelectric element which at least bends and vibrates and is used as an actuator. The piezoelectric element includes a laminate in which piezoelectric layers and internal electrodes are alternately laminated, and external electrodes disposed on an outer surface of the laminate. In this piezoelectric element, the number of wires connected to the external electrode is reduced to suppress inhibition of vibration of the piezoelectric element.

SUMMARY

An aspect of the present disclosure provides a piezoelectric element capable of improving a displacement amount.

A piezoelectric element according to an aspect of the present disclosure at least bends and vibrates. The piezoelectric element includes a laminate, a plurality of internal electrodes for generating a plurality of active regions in the laminate, and a plurality of external electrodes. The laminate includes a plurality of piezoelectric layers that is laminated. The laminate includes a pair of main faces facing away from each other in a laminating direction of the plurality of piezoelectric layers, a pair of end faces facing away from each other in a first direction crossing the laminating direction, and a pair of side faces facing away from each other in a second direction crossing the laminating direction and the first direction. The plurality of internal electrodes is disposed in the laminate to be laminated in the laminating direction. Each of the pair of main faces, the pair of end faces, and the pair of side faces is a polished surface that is polished. Each ridge portion of the laminate has a rounded chamfered shape.

In the piezoelectric element, each of the pair of main faces, the pair of end faces, and the pair of side faces is a polished surface that is polished. According to such a polished surface, as compared with the case of a natural surface, the displacement difference between a plurality of active regions is suppressed. Accordingly, the piezoelectric element can bend and vibrate in a well-balanced manner. As a result, the displacement amount of the piezoelectric element can be improved. Each ridge portion of the laminate has a rounded chamfered shape. Accordingly, it is possible to suppress concentration of strain on each ridge portion during driving. As a result, the cracks starting from each ridge portion in the laminate is suppressed.

The plurality of internal electrodes may include a first internal electrode and a second internal electrode that are alternately laminated in the laminating direction via a piezoelectric layer of the plurality of piezoelectric layers. The first internal electrode may include a plurality of electrode portions. The second internal electrode may oppose the plurality of electrode portions on the first internal electrode via the piezoelectric layer. The plurality of internal electrodes may be laminated in such a way that a pair of the second internal electrodes are arranged at both ends in the laminating direction. In this case, it is suppressed that the smoothness of the main faces is deteriorated due to the plurality of electrode portions. Therefore, the displacement difference between the plurality of active regions is suppressed. As a result, the displacement amount can be further improved.

The plurality of electrode portions may be arranged in two rows in each of the first direction and the second direction. The second internal electrode may further include a connector connecting a pair of electrode portions of the plurality of electrode portions, the pair of electrode portions being positioned diagonally. In this case, the vibration inhibition of the piezoelectric element is suppressed. As a result, the displacement amount can be further improved.

The plurality of piezoelectric layers may include a pair of first piezoelectric layers disposed at both ends in the laminating direction and a second piezoelectric layer disposed between the pair of first piezoelectric layers. A thickness of each of the pair of first piezoelectric layers may be thinner than a thickness of the second piezoelectric layer. In this case, since the first piezoelectric layer to be an inactive layer is thin, the displacement amount can be further improved.

The plurality of piezoelectric layers may include a pair of first piezoelectric layers disposed at both ends in the laminating direction. A radius of curvature of the ridge portion may be greater than a thickness of each of the pair of first piezoelectric layers. In this case, the internal electrodes disposed at both ends in the laminating direction are exposed at the ridge portions. Since the ridge portions have rounded chamfered shapes, the exposed areas of the internal electrodes disposed at both ends in the laminating direction are increased. Therefore, the connection strengths between the internal electrodes arranged at both ends in the laminating direction and the external electrode are improved.

The plurality of internal electrodes may include an internal electrode connected to a corresponding external electrode of the plurality of external electrodes at the ridge portion. In this case, since the ridge portion has a rounded chamfered shape, the exposed area of the internal electrode is increased at the ridge portion. Therefore, the connection strength between the internal electrode and the external electrode that is connected at the ridge portion is improved.

DETAILED DESCRIPTION

Figure 1:
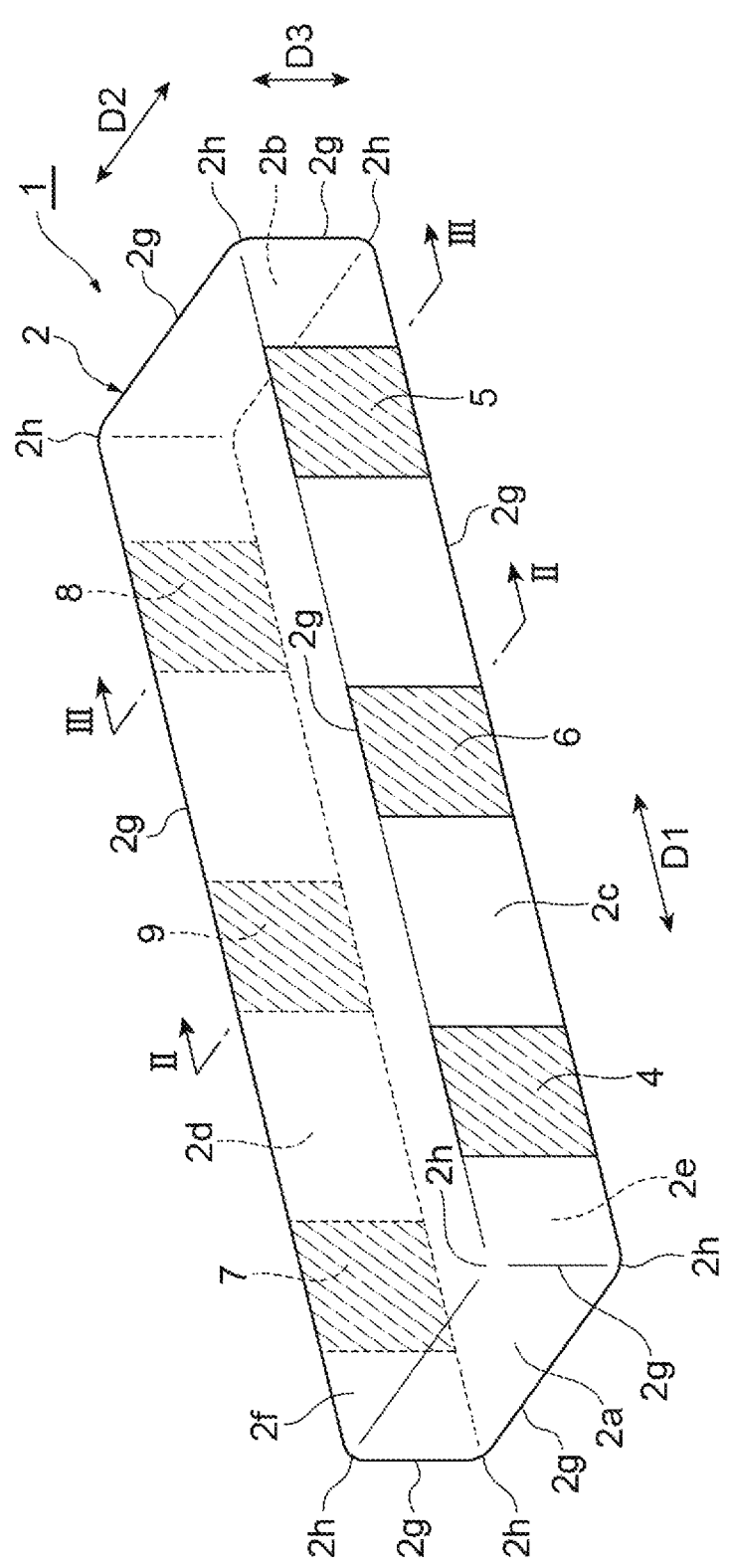
FIG. 1 is a perspective view illustrating a piezoelectric element according to an embodiment.

Hereinafter, embodiments of the present invention will be described in detail with reference to the accompanying drawings. In the following description, the same elements or elements having the same functions are denoted with the same reference numerals and overlapped explanation is omitted.

FIG. 1 is a perspective view illustrating a piezoelectric element according to an embodiment. The piezoelectric element 1 shown in FIG. 1 is used as a piezoelectric actuator. The piezoelectric element 1 has a function of at least bending vibration and moving a driven body when an AC voltage is applied. The piezoelectric element 1 includes a laminate 2 and a plurality of external electrodes 4, 5, 6, 7, 8 and 9. The laminate 2 has a rectangular parallelepiped shape. The rectangular parallelepiped shape includes a rectangular parallelepiped shape in which corner portions and ridge portions are chamfered and a rectangular parallelepiped shape in which corner portions and ridge portions are rounded. The laminate 2 includes a pair of end faces 2a and 2b facing away from each other, a pair of side faces 2c and 2d facing away from each other, and a pair of main faces 2e and 2f facing away from each other.

A direction D1 in which the end faces 2a and 2b faces away from each other, a direction D2 in which the side faces 2c and 2d faces away from each other, a direction D3 in which the main faces 2e and 2f faces away from each other intersect each other. In the present embodiment, the direction D1, the direction D2, and the direction D3 are orthogonal to each other. The direction D1 is the length direction of the laminate 2. The direction D2 is the width direction of the laminate 2. The direction D3 is the thickness direction of the laminate 2. The main faces 2e and 2f have a rectangular shape. The long side directions of the main faces 2e and 2f coincide with the direction D1. The short side directions of the main faces 2e and 2f coincide with the direction D2.

The end faces 2a and 2b extend in the width direction (direction D2) of the laminate 2 so as to connect the side faces 2c and 2d. The end faces 2a and 2b also extend in the thickness direction (direction D3) of the laminate 2 so as to connect the main faces 2e and 2f. The side faces 2c and 2d extend in the length direction (direction D1) of the laminate 2 so as to connect the end faces 2a and 2b. The side faces 2c and 2d also extend in the thickness direction of the laminate 2 so as to connect the main faces 2e and 2f. The main faces 2e and 2f extend in the length direction of the laminate 2 so as to connect the end faces 2a and 2b. The main faces 2e and 2f also extend in the width direction of the laminate 2 so as to connect the side faces 2c and 2d.

The width (length in the direction D2) of the laminate 2 is, for example, 2.5 mm. The length of the laminate 2 (the length in the direction D1) is, for example, 9 mm. The thickness (length in the direction D3) of the laminate 2 is, for example, 1 mm. The width of laminate 2 is greater than the thickness of laminate 2 and less than the length of laminate 2.

Each of the faces 2a, 2b, 2c, 2d, 2e and 2f of the laminate 2 is a polished surface polished by barrel polishing, for example. Each ridge portion 2g located between two adjacent faces of the faces 2a, 2b, 2c, 2d, 2e and 2f has a rounded chamfered shape. Each ridge portion 2g is constituted by a curved surface. Each corner portion 2h located among three adjacent faces of the faces 2a, 2b, 2c, 2d, 2e and 2f has a rounded chamfered shape. Each corner portion 2h is constituted by a curved surface. The radii of curvature of the ridge portion 2g and the corner portion 2h are, for example, 0.03 mm or more and 0.15 mm or less.

The external electrodes 4, 5, and 6 are disposed on the side face 2c of the laminate 2. The external electrodes 4, 5, and 6 are spaced apart from each other. The external electrodes 4, 5, and 6 are arranged side by side in the direction D1. The external electrode 4 is disposed on the end face 2a side. The external electrode 4 is spaced apart from the end face 2a. The external electrode 5 is disposed on the end face 2b side. The external electrode 5 is spaced apart from the end face 2b. The external electrode 6 is disposed between the external electrode 4 and the external electrode 5. The external electrode 6 is spaced apart from each of the external electrode 4 and the external electrode 5.

The external electrodes 4, 5, and 6 have the same shape. The external electrodes 4, 5, and 6 have a rectangular shape when viewed from the direction D2. Each of the external electrodes 4, 5, and 6 extends in the direction D3 so as to connect the main face 2e and the main face 2f. Each of the external electrodes 4, 5, and 6 is formed over the entire side face 2c in the direction D3. Each of the external electrodes 4, 5, and 6 is also disposed in the ridge portion 2g between the side face 2c and the main face 2e and in the ridge portion 2g between the side face 2c and the main face 2f.

The external electrodes 7, 8 and 9 are disposed on the side face 2d of the laminate 2. The external electrodes 7, 8 and 9 are spaced apart from each other. The external electrodes 7, 8 and 9 are arranged side by side in the direction D1. The external electrode 7 is disposed on the end face 2a side. The external electrode 7 is spaced apart from the end face 2a. The external electrode 8 is disposed on the end face 2b side. The external electrode 8 is spaced apart from the end face 2b. The external electrode 9 is disposed between the external electrode 7 and the external electrode 8. The external electrode 9 is spaced apart from each of the external electrode 7 and the external electrode 8.

The external electrodes 7, 8 and 9 have the same shape. The external electrodes 7, 8 and 9 have a rectangular shape when viewed from the direction D2. Each external electrode 7, 8 and 9 extends in the direction D3 so as to connect the main face 2e and the main face 2f. Each external electrode 7, 8 and 9 is formed over the entire side face 2d in the direction D3. Each external electrode 7, 8 and 9 is also disposed in the ridge portion 2g between the side face 2d and the main face 2e and in the ridge portion 2g between the side face 2d and the main face 2f.

The external electrode 4 and the external electrode 7 oppose each other in the direction D2. The external electrode 4 and the external electrode 7 are disposed so as to overlap each other when viewed from the direction D2. The external electrode 5 and the external electrode 8 oppose each other in the direction D2. The external electrode 5 and the external electrode 8 are disposed so as to overlap each other when viewed from the direction D2. The external electrode 6 and the external electrode 9 oppose each other in the direction D2. The external electrode 6 and the external electrode 9 are disposed so as to overlap each other when viewed from the direction D2.

The external electrodes 4, 5, 6, 7, 8 and 9 are formed on the side faces 2c and 2d by sputtering, for example. The external electrodes 4, 5, 6, 7, 8 and 9 may be formed by an evaporation method. Examples of the film structure constituting the external electrodes 4, 5, 6, 7, 8 and 9 include Cr/Ni, NiCu/Ag, SnAg, and Au. The thicknesses of the external electrodes 4, 5, 6, 7, 8 and 9 are, for example, 0.5 μm or more and 2.5 μm or less. The lengths of the external electrodes 4, 5, 6, 7, 8 and 9 in the direction D1 are, for example, 1 mm or more and 1.5 mm or less.

The external electrodes 4, 5, 6, 7, 8 and 9 may be fired electrode layers formed by firing a conductive paste. As the conductive paste, a conductive paste containing a conductive material containing Ag as a main component can be used. The external electrodes 4, 5, 6, 7, 8 and 9 may further include a plating layer formed by electroplating. Examples of the plating layer include a Ni/Au plating layer.

Figure 2:
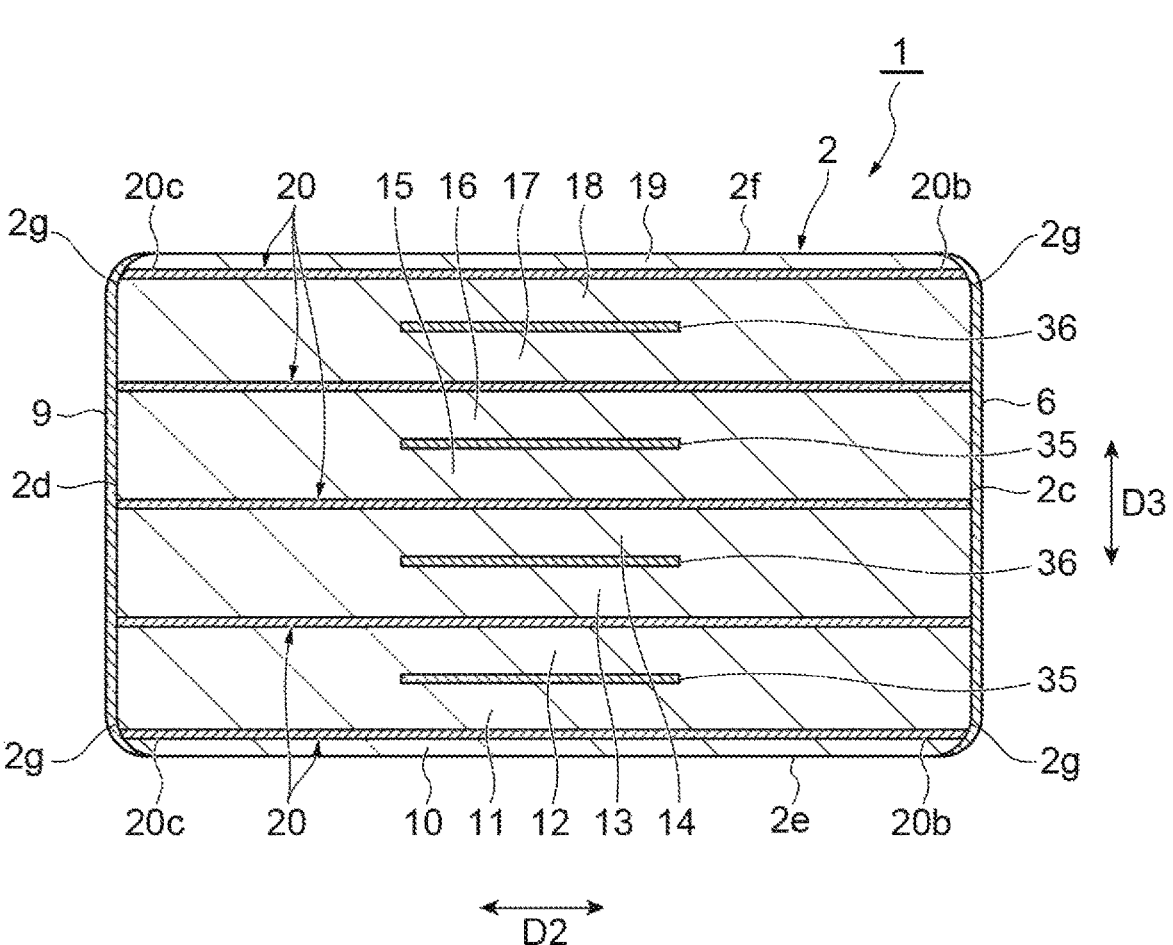
FIG. 2 is a cross-sectional view taken along line II-II of FIG. 1.
Figure 3:
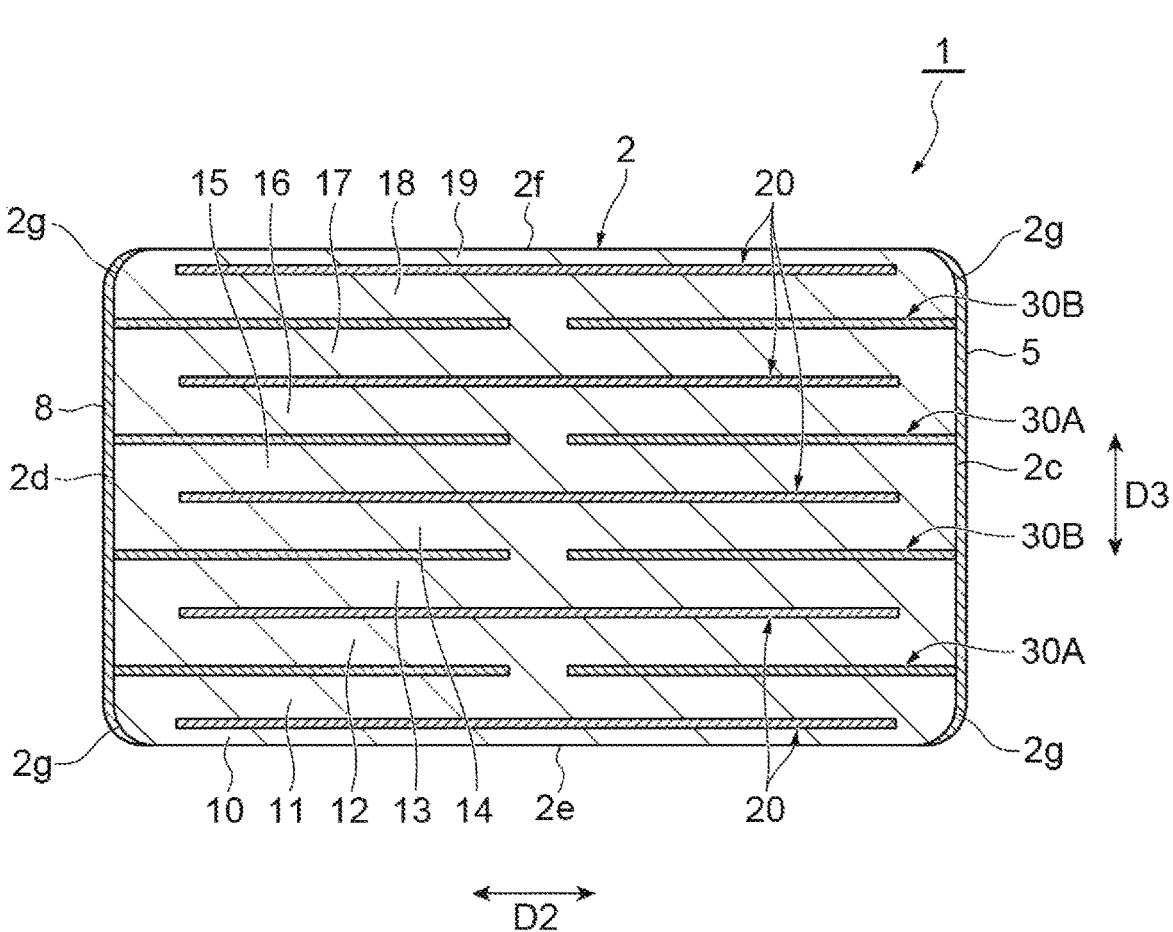
FIG. 3 is a cross-sectional view taken along line III-Ill of FIG. 1.
Figure 4:
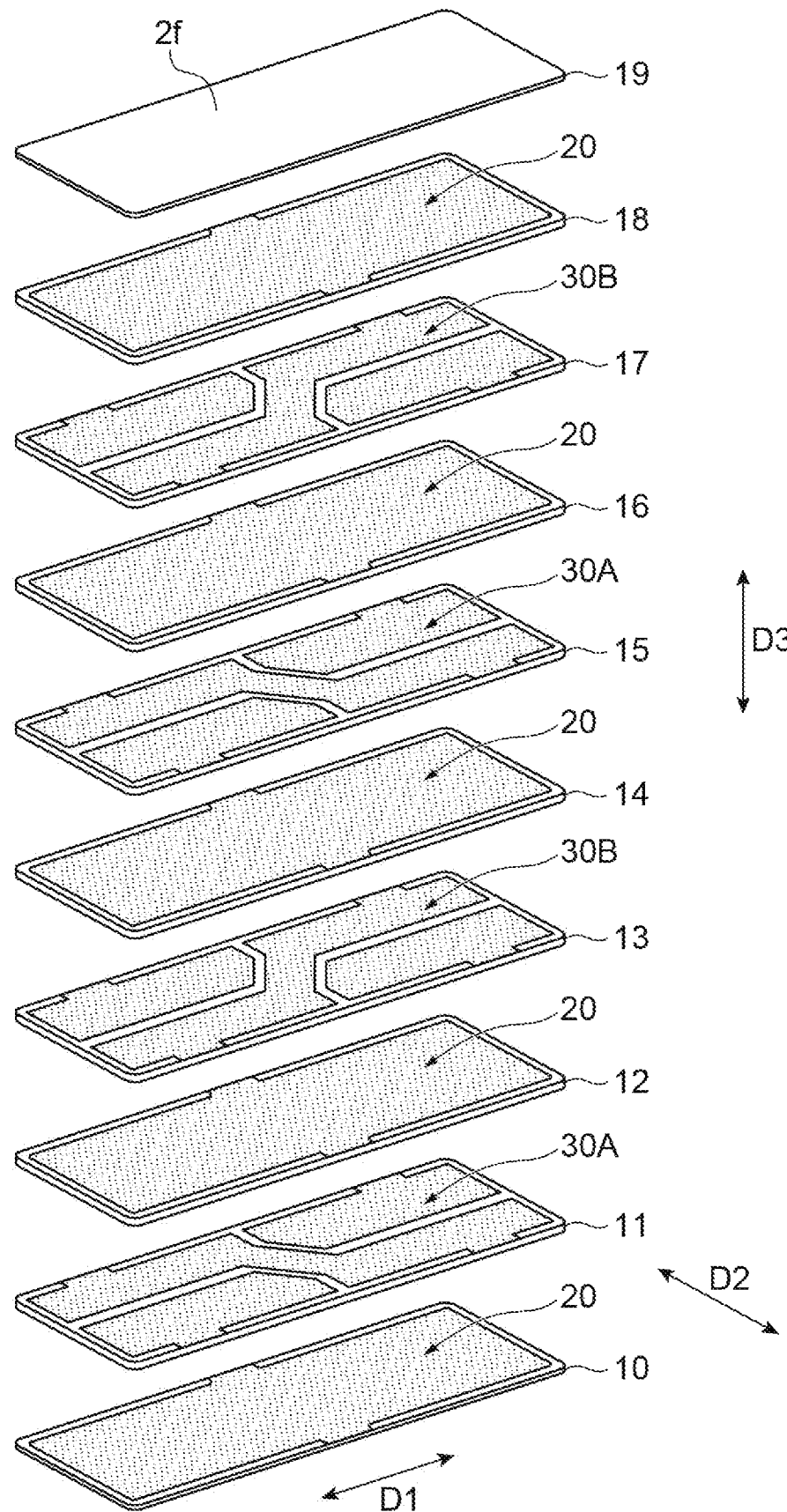
FIG. 4 is an exploded perspective view of the piezoelectric element of FIG. 1.

FIG. 2 is a cross-sectional view taken along line II-II of FIG. 1. FIG. 3 is a cross-sectional view taken along line III-III of FIG. 1. FIG. 4 is an exploded perspective view of the piezoelectric element of FIG. 1. As shown in FIG. 4, the laminate 2 includes piezoelectric layers 10 to 19 laminated in the direction D3. The laminate 2 is formed by laminating piezoelectric layers 10 to 19 in the direction D3. The laminating direction of the piezoelectric layers 10 to 19 coincides with the direction in which the main faces 2e and 2f faces away from each other. The piezoelectric layers 10 to 19 have a rectangular plate shape.

The piezoelectric layers 10 and 19 are disposed at both ends in the laminating direction (direction D3). The outer surface of the piezoelectric layer 10 constitutes the main face 2e. The outer surface of the piezoelectric layer 19 constitutes the main face 2f. The piezoelectric layers 11 to 18 are disposed between the piezoelectric layers 10 and 19 in the laminating direction. The thickness (length in the direction D3) of each of the piezoelectric layers 10 and 19 disposed at both ends in the laminating direction is thinner than the thickness (length in the direction D3) of each of the piezoelectric layers 11 to 18 disposed between the piezoelectric layers 10 and 19. The thickness of each of the piezoelectric layers 11 to 18 is, for example, 4 times or more and 8 times or less the thickness of each of the piezoelectric layers 10 and 19.

The thicknesses of the piezoelectric layers 10 and 19 are smaller than the radius of curvature of the ridge portion 2g. The radius of curvature of the ridge portion 2g is, for example, greater than 1 times and less than or equal to 5 times the thickness of each piezoelectric layers 10 and 19. The thickness of the piezoelectric layers 10 and 19 is, for example, 0.02 μm or more and 0.03 μm or less. In the laminating direction, the thicknesses of the piezoelectric layers 11 to 18 are, for example, 0.12 μm or more and 0.2 μm or less. In the present embodiment, the piezoelectric layers 10 and 19 have the same thickness, but may have different thicknesses. The plurality of piezoelectric layers 11 to 18 have the same thickness but may be different from each other.

Each of the piezoelectric layers 10 to 19 is made of a piezoelectric ceramic material. Examples of the piezoelectric ceramic material include PZT [Pb(Zr,Ti)$_3$], PT(PbTiO$_3$), PLZT[(Pb,La)(Zr,Ti)$_3$] and barium titanate (BaTiO$_3$). Each of the piezoelectric layers 10 to 19 is a sintered body of a ceramic green sheet containing a piezoelectric ceramic material. In the actual laminate 2, the piezoelectric layers 10 to 19 are integrated in such a way that boundaries between the piezoelectric layers 10 to 19 cannot be visually recognized.

The piezoelectric element 1 includes a plurality of internal electrodes 20, 30A and 30B that is disposed in the laminate 2 to generate a plurality of active regions in the laminate 2. In the piezoelectric element 1, the internal electrodes 30A and 30B serving as first internal electrodes and the internal electrode 20 serving as a second internal electrode are alternately arranged via the piezoelectric layers 10 to 19. The first internal electrode may be either of the internal electrodes 30A and 30B. However, the piezoelectric element 1 needs to have at least one internal electrode 30A and at least one internal electrode 30B. The plurality of internal electrodes 20, 30A and 30B are laminated such that the pair of internal electrodes 20 are positioned at both ends in the laminating direction (direction D3).

In the embodiment, the piezoelectric element 1 includes a plurality of internal electrodes 20, a plurality of internal electrodes 30A, and a plurality of internal electrodes 30B. Specifically, the piezoelectric element 1 includes two internal electrodes 30 disposed on the piezoelectric layers 10, 12, 14, 16 and 18, five internal electrodes 20A disposed on the piezoelectric layers 11 and 15, and two internal electrodes 30B disposed on the piezoelectric layers 13 and 17.

The plurality of internal electrodes 20 are disposed between the piezoelectric layer 10 and the piezoelectric layer 11, between the piezoelectric layer 12 and the piezoelectric layer 13, between the piezoelectric layer 14 and the piezoelectric layer 15, between the piezoelectric layer 16 and the piezoelectric layer 17, and between the piezoelectric layer 18 and the piezoelectric layer 19, respectively. The plurality of internal electrodes 30A are disposed between the piezoelectric layer 11 and the piezoelectric layer 12, and between the piezoelectric layer 15 and the piezoelectric layer 16, respectively. The plurality of internal electrodes 30B are disposed between the piezoelectric layer 13 and the piezoelectric layer 14, and between the piezoelectric layer 17 and the piezoelectric layer 18, respectively.

The internal electrode 30A disposed on the piezoelectric layer 11 opposes the internal electrode 20 via the piezoelectric layer 11 and opposes the internal electrode 20 via the piezoelectric layer 12. The internal electrode 30B disposed on the piezoelectric layer 13 opposes the internal electrode 20 via the piezoelectric layer 13 and opposes the internal electrode 20 via the piezoelectric layer 14. The internal electrode 30A disposed on the piezoelectric layer 15 opposes the internal electrode 20 via the piezoelectric layer 15 and opposes the internal electrode 20 via the piezoelectric layer 16. The internal electrode 30B disposed on the piezoelectric layer 17 opposes the internal electrode 20 via the piezoelectric layer 17 and opposes the internal electrode 20 via the piezoelectric layer 18.

Each of the internal electrodes 20, 30A and 30B includes a conductive material (for example, Ag/Pd, Pt, Pd, or Cu). Each of the internal electrodes 20, 30A and 30B is formed as a sintered body of a conductive paste containing the conductive material.

Figure 5:
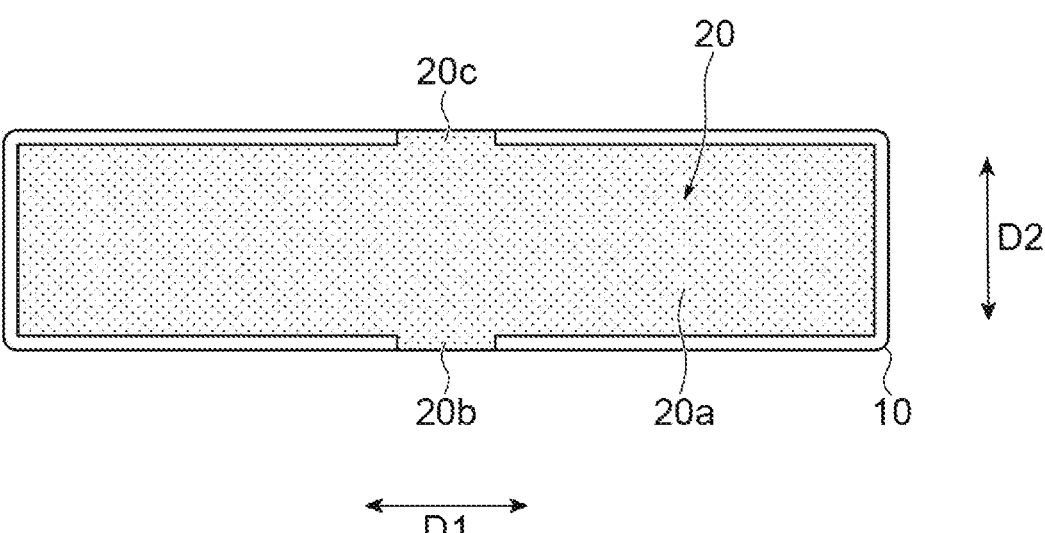
FIG. 5 is a plan view showing an internal electrode disposed on a piezoelectric layer.

FIG. 5 is a plan view showing the internal electrode 20 disposed on the piezoelectric layer 10. As shown in FIG. 5, the internal electrode 20 includes a main electrode part 20a and connecting parts 20b and 20c. The external electrodes 6 and 9 correspond to the main electrode part 20a. The main electrode part 20a has a rectangular shape in which the longitudinal direction of the laminate 2 is the longitudinal direction of the main electrode part 20a. The main electrode part 20a is spaced apart from the end faces 2a and 2b and the side faces 2c and 2d.

As also shown in FIG. 2, the connecting part 20b extends from one side face along the longitudinal direction (direction D1) of the main electrode part 20a toward the side face 2c of the laminate 2, and is exposed at the ridge portion 2g between the side face 2c and the main face 2e of the laminate 2. The connecting part 20b is located at the center of the laminate 2 in the longitudinal direction (direction D1). The connecting part 20c extends from the other side face along the longitudinal direction of the main electrode part 20a to the side face 2d side of the laminate 2, and is exposed at the ridge portion 2g between the side face 2d and the main face 2e of the laminate 2. The connecting part 20c is located at the center of the laminate 2 in the longitudinal direction.

Figure 6:
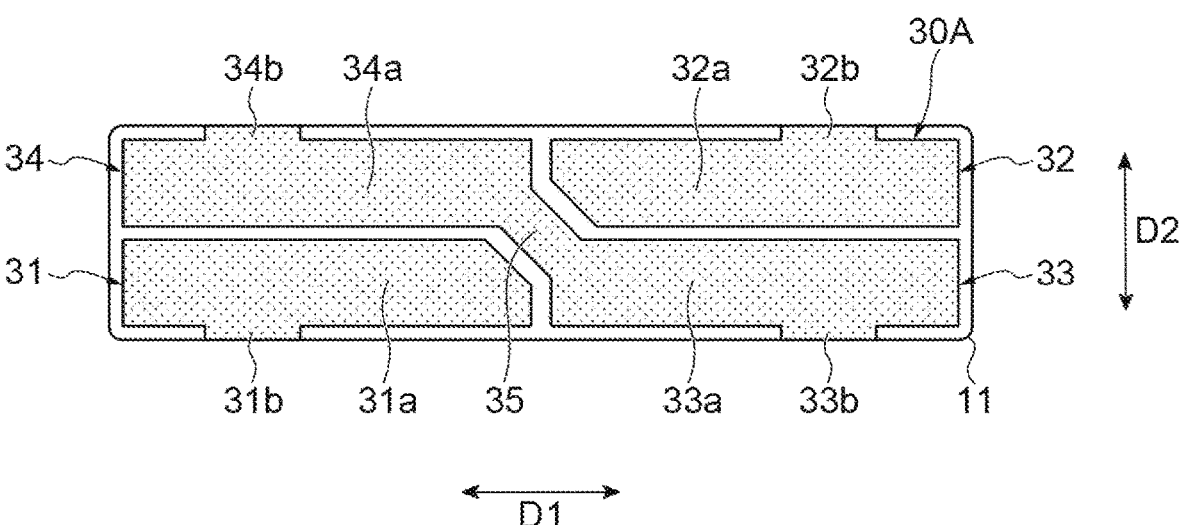
FIG. 6 is a plan view showing an internal electrode disposed on a piezoelectric layer.
Figure 7:
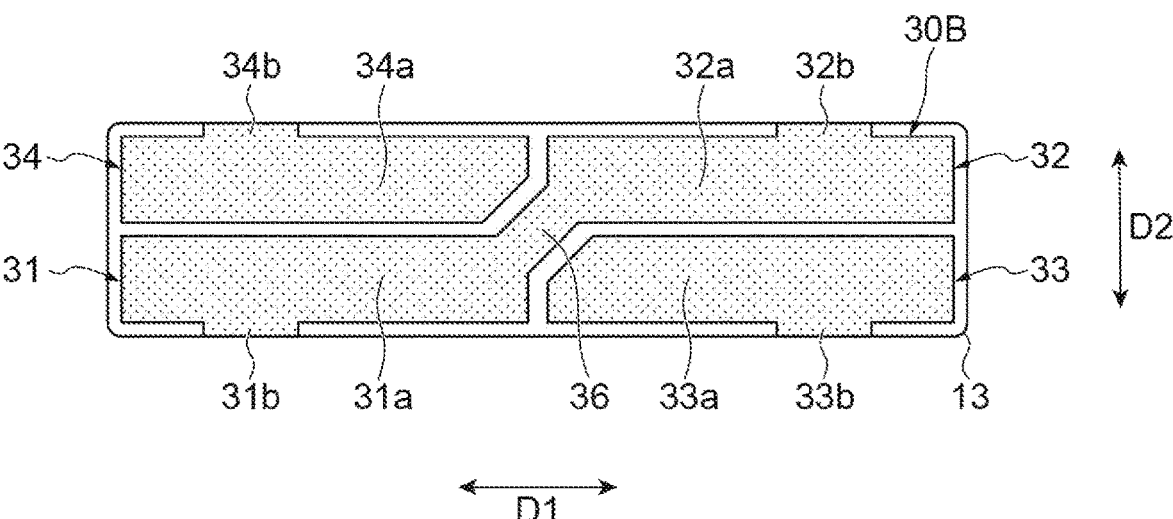
FIG. 7 is a plan view showing an internal electrode disposed on a piezoelectric layer.

The internal electrodes 20 having the same shape as that of the piezoelectric layer 10 are disposed on the piezoelectric layers 12, 14, 16 and 18. Each internal electrode 20 opposes a plurality of electrode portions 31, 32, 33 and 34 via the piezoelectric layers 11 to 18, and functions as a common electrode. As shown in FIGS. 6 and 7, a plurality of electrode portions 31, 32, 33 and 34 are included in the internal electrodes 30A and 30B.

In the internal electrodes 20 disposed on the piezoelectric layers 12, 14 and 16, the connecting part 20b is exposed at the side face 2c of the laminate 2, and the connecting part 20c is exposed at the side face 2d of the laminate 2. In the internal electrode 20 disposed on the piezoelectric layer 18, the connecting part 20b is exposed at the ridge portion 20g between the side face 2c and the main face 2f of the laminate 2, and the connecting part 20c is exposed at the ridge portion 20g between the side face 2d and the main face 2f of the laminate 2. The connecting part 20b of each internal electrode 20 is connected to the external electrode 6. The connecting part 20c of each internal electrode 20 is connected to the external electrode 9. The internal electrode 20 disposed on the piezoelectric layer 10,18 is connected to the corresponding external electrodes 6 and 9 at the ridge portion 20g. The internal electrodes 20 disposed on the piezoelectric layers 12, 14 and 16 are connected to the external electrodes 6 and 9 at the side faces 2c and 2d.

FIG. 6 is a plan view showing the internal electrode 30A disposed on the piezoelectric layer 11. As shown in FIG. 6, the internal electrode 30A includes electrode portions 31, 32, 33 and 34 and a connector 35. An internal electrode 30A having the same shape as that on the piezoelectric layer 11 is also disposed on the piezoelectric layer 15.

The electrode portions 31, 32, 33 and 34 are arranged in a matrix of two rows in each of the directions D1 and D2. The electrode portions 31 and 33 are arranged along the direction D1 on the side face 2c side. The electrode portions 32 and 34 are arranged along the direction D1 on the side face 2d side. The electrode portions 31 and 34 are arranged along the direction D2 on the end face 2a side. The electrode portions 32 and 33 are arranged along the direction D2 on the end face 2b side.

The electrode portions 31, 32, 33 and 34 are disposed in each of four divided regions. The four regions are obtained by dividing the piezoelectric layer 11 into two regions in each of the direction D1 and the direction D2. The electrode portions 31 and 32 are positioned diagonally to each other. The electrode portions 33 and 34 are positioned diagonally to each other. The electrode portions 31 and 32 are spaced apart from each other on the piezoelectric layer 11. The electrode portions 33 and 34 are connected to each other by a connector 35 on the piezoelectric layer 11.

The electrode portion 31 is disposed on the piezoelectric layer 11 at the corner portion side formed by the end face 2a and the side face 2c of the laminate 2. The electrode portion 31 includes a main electrode part 31a and a connecting part 31b. The main electrode part 31a and the connecting part 31b are integrally formed. The main electrode part 31a has a substantially rectangular shape and is spaced apart from the end faces 2a and 2b and the side faces 2c and 2d. The connecting part 31b extends from the main electrode part 31a toward the side face 2c to be exposed at the side face 2c.

The electrode portion 32 is disposed on the piezoelectric layer 11 at the corner portion side formed by the end face 2b and the side face 2d of the laminate 2. The corner portion at which the electrode portion 32 is disposed and the corner portion at which the electrode portion 31 are positioned diagonally to each other. The electrode portion 32 includes a main electrode part 32a and a connecting part 32b. The main electrode part 32a and the connecting part 32b are integrally formed. The main electrode part 32a has a substantially rectangular shape and is spaced apart from the end faces 2a and 2b and the side faces 2c and 2d. The connecting part 32b extends from the main electrode part 32a toward the side face 2d to be exposed at the side face 2d.

The electrode portion 33 is disposed on the piezoelectric layer 11 on the corner portion side formed by the end face 2b and the side face 2c of the laminate 2. The electrode portion 33 includes a main electrode part 33a and a connecting part 33b. The main electrode part 33a and the connecting part 33b are integrally formed. The main electrode part 33a has a substantially rectangular shape and is spaced apart from the end faces 2a and 2b and the side faces 2c and 2d. The connecting part 33b extends from the main electrode part 33a toward the side face 2c to be exposed at the side face 2c.

The electrode portion 34 is disposed on the piezoelectric layer 11 at the corner portion side formed by the end face 2a and the side face 2d of the laminate 2. The corner portion at which the electrode portion 34 is disposed and the corner portion at which the electrode portion 33 are positioned diagonally to each other. The electrode portion 34 includes a main electrode part 34a and a connecting part 34b. The main electrode part 34a and the connecting part 34b are integrally formed. The main electrode part 34a has a substantially rectangular shape and is spaced apart from the end faces 2a and 2b and the side faces 2c and 2d. The connecting part 34b extends from the main electrode part 34a toward the side face 2d to be exposed at the side face 2d.

The connector 35 electrically connects the electrode portions 33 and 34. Specifically, the connector 35 electrically and physically connects the main electrode part 33a of the electrode portion 33 and the main electrode part 34a of the electrode portion 34. The connector 35 is disposed at the center of the piezoelectric layer 11 in the directions D1 and D2. The connector 35 is disposed between the electrode portion 31 and the electrode portion 32 which are positioned diagonally and separated by a predetermined gap. The connector 35 is spaced away from each of the electrode portion 31 and the electrode portion 32. The connector 35 extends in a direction inclined with respect to the direction D1 and the direction D2 when viewed from the direction D3.

The lengths of the connecting parts 20b, 20c, 31b, 32b, 33b and 34b in the direction D1 are, for example, equal to each other and are 0.9 mm or more and 1.4 mm or less. The lengths of the connecting parts 20b, 20c, 31b, 32b, 33b and 34b in the direction D1 are equal to or less than to the lengths of the external electrodes 4, 5, 6, 7, 8 and 9 in the direction D1. As a result, since the exposed portion of the internal electrode is protected by the external electrode, it is possible to prevent the solder used for connecting a flexible printed substrate (FPC) or the like to the external electrode from penetrating into the internal electrode side (solder leaching of the internal electrode).

FIG. 7 is a plan view showing the internal electrode 30B disposed on the piezoelectric layer 13. As shown in FIG. 7, the internal electrode 30B is different from the internal electrode 30A in that a connector 36 is included instead of the connector 35 (see FIG. 6). The connector 36 electrically connects the electrode portions 31 and 32. Specifically, the connector 36 electrically and physically connects the main electrode part 31a of the electrode portion 31 and the main electrode part 32a of the electrode portion 32. The connector 35 is disposed at the center of the piezoelectric layer 13 in the directions D1 and D2. The connector 36 is disposed between the electrode portions 33 and 34 which are positioned diagonally and separated by a predetermined gap. The connector 36 is spaced away from each of the electrode portions 33 and 34. The connector 36 extends in a direction inclined with respect to the directions D1 and D2 when viewed from the direction D3. The internal electrode 30B which has the same shape as that on the piezoelectric layer 13 is also disposed on the piezoelectric layer 17.

In each of the internal electrodes 30A and 30B, the plurality of connecting part 31b are connected to the external electrode 4 at the side face 2c. The plurality of electrode portions 31 are electrically connected to each other via the external electrode 4. The plurality of connecting parts 32*b* are connected to the external electrode 8 at the side face 2*d*. The plurality of electrode portions 32 are electrically connected to each other via the external electrode 8. The plurality of connecting parts 33*b* are connected to the external electrode 5 at the side face 2*c*. The plurality of electrode portions 33 are electrically connected to each other via the external electrode 5. The plurality of connecting parts 34*b* are connected to the external electrode 7 at the side face 2*d*. The plurality of electrode portions 34 are electrically connected to each other via the external electrode 7.

As described above, in the internal electrode 30A, the electrode portions 33 and 34 are connected to each other via the connector 35. In the internal electrode 30B, the electrode portions 31 and 32 are connected to each other via the connector 36. Therefore, all the electrode portions 31 and 32 are electrically connected to each other via the connector 36, the external electrode 4 and the external electrode 8. All the electrode portions 33 and 34 are electrically connected to each other via the connector 35, the external electrode 5 and the external electrode 7.

An example of a method of manufacturing the piezoelectric element 1 will be described. First, a ceramic paste for forming the piezoelectric layers 10 to 19 and a conductive paste for forming the internal electrodes 20, 30A and 30B are prepared. The ceramic paste includes, for example, the above-described piezoelectric ceramic material and an organic vehicle. The conductive paste includes, for example, a powder of the above-described conductive material and an organic vehicle. The organic vehicle includes a binder and a solvent. The solvent is, for example, an organic solvent.

Next, a ceramic green sheet is formed using the above-described ceramic paste. In this process, for example, after the ceramic paste is applied in a sheet shape onto the carrier film, the sheet-shaped ceramic paste is dried. Thus, a ceramic green sheet is obtained. The ceramic paste is applied by, for example, a doctor blade method. Next, a plurality of internal electrode patterns is formed on the ceramic green sheet using a conductive paste. In this process, for example, after the conductive paste is applied in a pattern shape onto the ceramic green sheet, the conductive paste is dried. Thus, a plurality of internal electrode patterns is obtained. The internal electrode paste is applied by, for example, a screen printing method.

Next, the ceramic green sheets on which the internal electrode patterns are formed are laminated to form a green laminate. The green laminate is then fired. Thus, a laminate substrate is formed. The laminate substrate is then diced. In this process, for example, the laminate substrate is cut into chips by a cutting machine. Thus, a plurality of laminates having a predetermined size are obtained. Next, the laminate is subjected to round chamfering. The round chamfering is, for example, barrel polishing. As a result, a laminate 2 including the ridge portions 2*g* and the corner portions 2*h* which are rounded is obtained.

Next, the external electrodes 4, 5, 6, 7, 8 and 9 are formed on the side faces 2*c* and 2*d*. In this process, the external electrodes 4, 5, 6, 7, 8 and 9 are formed by, for example, a sputtering method. Thereafter, the laminate 2 is polarized. Thus, the piezoelectric element 1 is completed.

In the piezoelectric element 1 configured as described above, for example, different voltages are applied to the external electrodes 4, 5 and 6 by a wiring member disposed on the side face 2*c*. As an example, the external electrode 6 is connected to the ground, and voltages whose phases are shifted by 90° with each other are applied to the external electrodes 4 and 5. As a result, a plurality of piezoelectrically active regions are formed in laminate 2. The plurality of active regions are formed corresponding to the electrode portion 31, 32, 33 and 34.

Specifically, among the piezoelectric layers 11 to 18, a region overlapping the electrode portion 31, 32, 33 and 34 when viewed from the direction D3 is the active region. Among the piezoelectric layers 11 to 18, regions sandwiched between the main electrode part 31*a* of the electrode portion 31 and the main electrode part 20*a* of the internal electrode 20, between the main electrode part 32*a* of the electrode portion 32 and the main electrode part 20*a* of the internal electrode 20, between the main electrode part 33*a* of the electrode portion 33 and the main electrode part 20*a* of the internal electrode 20, and between the main electrode part 34*a* of the electrode portion 34 and the main electrode part 20*a* of the internal electrode 20 are active regions.

The piezoelectric element 1 has two resonance modes during driving. The piezoelectric element 1 vibrates by the superposing a longitudinal vibration mode vibrating in the direction D1 and a bending vibration mode in the direction D2. In the piezoelectric element 1, for example, the active region corresponding to the electrode portions 31 and 32 and the active region corresponding to the electrode portions 33 and 34 are displaced in opposite directions along the direction D1. That is, one active region is extended along the direction D1, and the other active region is contracted along the direction D1. Accordingly, the piezoelectric element 1 bends and vibrates in an S-shape when viewed from the direction D3.

As described above, in the piezoelectric element 1, the end faces 2*a* and 2*b*, the side faces 2*c* and 2*d*, and the main faces 2*e* and 2*f* are polished surfaces. According to such polished surfaces, waviness and unevenness particular to natural surfaces are eliminated. Therefore, as compared with the case of a natural surface, the displacement difference between a plurality of active regions is suppressed. Accordingly, the piezoelectric element 1 can bend and vibrate in a well-balanced manner. As a result, the displacement amount of the piezoelectric element 1 can be improved.

Each ridge portion 2*g* of the laminate 2 has a rounded chamfered shape. Accordingly, it is possible to suppress concentration of strain on each ridge portion 2*g* during driving. As a result, the cracks starting from each ridge portion 2*g* in the laminate 2 is suppressed. The piezoelectric layers 10 and 19 disposed at the lamination ends are piezoelectrically inactive layers and inhibit displacement. Since the ridge portions 2*g* adjacent to the main faces 2*e* and 2*f* have chamfered shapes, it is possible to reduce the volume of the piezoelectric layers 10 and 19 that inhibits displacement. Therefore, it is easy to improve the displacement amount.

In the laminate 2, when viewed from the direction D3, in the regions outside the internal electrodes 20, 30A and 30B, that is, in the regions near the end faces 2*a* and 2*b* and the side faces 2*c* and 2*d*, the electric fields are formed so as to curve from the end portions of the internal electrodes 30A and 30B to the end portions of the adjacent internal electrodes 20. Since the ridge portion 2*g* has a rounded chamfered shape, it is difficult to prevent the curved electric field from flowing around as compared with the case of a flat chamfered shape.

The plurality of internal electrodes 20, 30A and 30B are laminated such that the pair of internal electrodes 20 are positioned at both ends in the laminating direction (direction D3). That is, the pair of internal electrodes 20 is adjacent to the piezoelectric layers 10 and 19. If the internal electrodes 30A and 30B including the plurality of electrode portions 31, 32, 33 and 34 are disposed at the lamination ends and are adjacent to the piezoelectric layers 10 and 19, the smoothness of the main faces 2e and 2f may be deteriorated due to the plurality of electrode portions 31, 32, 33 and 34. In particular, since the piezoelectric layers 10 and 19 are thinner than the other piezoelectric layers 11 to 18, the shapes of the plurality of electrode portions 31, 32, 33 and 34 may be reflected on the main faces 2e and 2f. On the other hand, the internal electrode 20 is a common electrode and is integrally disposed over substantially the entire piezoelectric layers 10 and 19. Therefore, in the piezoelectric element 1, a decrease in smoothness of the main faces 2e and 2f is suppressed. As a result, it is possible to suppress the displacement difference between the plurality of active regions and further improve the displacement amount.

Since the pair of internal electrodes 20 are disposed at both ends in the laminating direction, the electric fields of the internal electrodes 30A and 30B are prevented from leaking to the outside of the laminate 2 and becoming noise. Thus, the operation of the piezoelectric element 1 can be stabilized.

The internal electrode 30A includes the connector 35 that connects the electrode portions 33 and 34 positioned diagonally to each other. The internal electrode 30B includes the connector 36 that connects the electrode portions 31 and 32 positioned diagonally to each other. As a result, the number of wires connected to the external electrodes 4 to 9 in order to apply voltages to the external electrodes 4 to 9 can be reduced. In addition, it is not necessary to provide a connection electrode for connecting the electrode portions 31 and 32 to each other and a connection electrode for connecting the electrode portions 33 and 34 to each other outside the laminated body 2. Accordingly, the vibration inhibition of the piezoelectric element 1 by the wires and the connection electrodes is suppressed. As a result, the displacement amount can be further improved.

The thickness of the piezoelectric layers 10 and 19 disposed at the lamination ends is thinner than the thickness of the piezoelectric layers 11 to 18 disposed between the piezoelectric layer 10 and the piezoelectric layer 19. As described above, the piezoelectric layers 10 and 19 are piezoelectrically inactive layers and inhibit displacement. Since the thickness of the piezoelectric layers 10 and 19 which inhibits the displacement is thin, the displacement amount can be further improved.

The radius of curvature of the ridge portion 2g is greater than the thicknesses of the piezoelectric layers 10 and 19. Therefore, the internal electrodes 20 disposed at the lamination ends are exposed at the ridge portions 2g and are connected to the external electrodes 6 and 9 at the ridge portions 2g. Since the ridge portions 2g have rounded chamfered shapes, the exposed areas of the internal electrodes 20 disposed at the lamination ends are increased. Therefore, the connection strengths between the internal electrodes 20 arranged at the lamination ends and the external electrodes 6 and 9 are improved.

The present invention is not necessarily limited to the above-described embodiments, and various modifications can be made with the spirit and the scope thereof.

In the above embodiment, the laminate 2 is formed by laminating the piezoelectric layers 10 to 19. However, the number of piezoelectric layers to be laminated is not limited and may be appropriately set according to design. In the above-described embodiment, the pair of internal electrodes 20 is disposed at the lamination ends, but the internal electrodes 30A and 30B may be disposed. The internal electrodes 30A and 30B may be exposed at the ridge portion 2g. The piezoelectric layers 10 to 19 may have the same thickness.

The invention claimed is:

1. A piezoelectric element that at least bends and vibrates, the piezoelectric element comprising:
   a laminate including a plurality of piezoelectric layers that is laminated, the laminate having ridge portions at corners thereof;
   a plurality of internal electrodes disposed in the laminate to be laminated in a laminating direction of the plurality of piezoelectric layers and to generate a plurality of active regions in the laminate; and
   a plurality of external electrodes,
   wherein the laminate includes:
      a pair of main faces facing away from each other in the laminating direction;
      a pair of end faces facing away from each other in a first direction crossing the laminating direction; and
      a pair of side faces facing away from each other in a second direction crossing the laminating direction and the first direction,
   wherein each of the pair of main faces, the pair of end faces, and the pair of side faces is a polished surface that is polished,
   wherein each of the ridge portions of the laminate has a rounded chamfered shape,
   wherein a portion of the external electrodes that contacts the internal electrodes contains Ag as a main component,
   wherein the plurality of piezoelectric layers includes a pair of first piezoelectric layers disposed at both ends in the laminating direction, and
   a radius of curvature of each of the ridge portions is greater than a thickness of each of the pair of first piezoelectric layers.

2. The piezoelectric element according to claim 1,
   wherein the plurality of internal electrodes includes a first internal electrode and a second internal electrode that are alternately laminated in the laminating direction via a piezoelectric layer of the plurality of piezoelectric layers,
   the first internal electrode includes a plurality of electrode portions,
   the second internal electrode opposes the plurality of electrode portions on the first internal electrode via the piezoelectric layer, and
   the plurality of internal electrodes is laminated in such a way that a pair of the second internal electrodes are arranged at both ends in the laminating direction.

3. The piezoelectric element according to claim 2,
   wherein the plurality of electrode portions is arranged in two rows in each of the first direction and the second direction, and
   the second internal electrode further includes a connector connecting a pair of electrode portions of the plurality of electrode portions, the pair of electrode portions being positioned diagonally.

4. The piezoelectric element according to claim 1,
   wherein the plurality of piezoelectric layers includes a second piezoelectric layer disposed between the pair of first piezoelectric layers, and
   a thickness of each of the pair of first piezoelectric layers is thinner than a thickness of the second piezoelectric layer.

5. The piezoelectric element according to claim 1, wherein the plurality of internal electrodes includes an internal electrode connected to a corresponding external electrode of the plurality of external electrodes at the ridge portions.

\* \* \* \* \*